(12) United States Patent
Ko (10) Patent No.: US 11,735,510 B2
(45) Date of Patent: Aug. 22, 2023

(54) PRINTED CIRCUIT BOARD AND ELECTRONIC COMPONENT PACKAGE

(71) Applicant: SAMSUNG ELECTRO-MECHANICS CO., LTD., Suwon-si (KR)

(72) Inventor: Chan Hoon Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 34 days.

(21) Appl. No.: 17/227,860

(22) Filed: Apr. 12, 2021

(65) Prior Publication Data
US 2022/0189865 A1 Jun. 16, 2022

(30) Foreign Application Priority Data
Dec. 16, 2020 (KR) .................. 10-2020-0176667

(51) Int. Cl.
*H01L 23/498* (2006.01)
*H01L 21/48* (2006.01)
*H01L 23/00* (2006.01)
*H01L 23/31* (2006.01)

(52) U.S. Cl.
CPC .... *H01L 23/49838* (2013.01); *H01L 21/4846* (2013.01); *H01L 23/3185* (2013.01); *H01L 23/49822* (2013.01); *H01L 23/49866* (2013.01); *H01L 24/16* (2013.01); *H01L 24/48* (2013.01); *H01L 24/73* (2013.01); *H01L 2224/16227* (2013.01); *H01L 2224/16238* (2013.01); *H01L 2224/48229* (2013.01); *H01L 2224/73257* (2013.01)

(58) Field of Classification Search
None
See application file for complete search history.

(56) References Cited

U.S. PATENT DOCUMENTS

| | | | |
|---|---|---|---|
| 2012/0252168 A1* | 10/2012 | Nah | H01L 21/4853 257/E21.502 |
| 2015/0357277 A1 | 12/2015 | Nagai et al. | |
| 2017/0263545 A1* | 9/2017 | Tsukamoto | H01L 23/49822 |
| 2017/0372997 A1* | 12/2017 | Tsukamoto | H01L 21/4857 |

FOREIGN PATENT DOCUMENTS

| | | |
|---|---|---|
| KR | 10-2015-0130519 A | 11/2015 |
| KR | 10-2017-0136510 A | 12/2017 |
| WO | 2016/164125 A1 | 10/2016 |

* cited by examiner

*Primary Examiner* — Hung K Vu
(74) *Attorney, Agent, or Firm* — Morgan, Lewis & Bockius LLP (57) ABSTRACT

A printed circuit board includes an insulating layer; and an external connection pad embedded in the insulating layer and having one surface exposed. The external connection pad may include a base pad portion having a first pattern portion in contact with a side surface of the insulating layer and having a first width, and a second pattern portion protruding from the first pattern portion and having a second width smaller than the first width, the second pattern portion having a gap with the side surface of the insulating layer, and a surface treatment layer disposed in the gap between the second pattern portion and the insulating layer and extending on an upper surface of the second pattern portion.

20 Claims, 6 Drawing Sheets

PRINTED CIRCUIT BOARD AND ELECTRONIC COMPONENT PACKAGE

CROSS-REFERENCE TO RELATED APPLICATION(S)

The present application claims the benefit of priority to Korean Patent Application No. 10-2020-0176667, filed on Dec. 16, 2020 in the Korean Intellectual Property Office, the disclosure of which is incorporated herein by reference in its entirety.

TECHNICAL FIELD

The present disclosure relates to a printed circuit board and an electronic component package including the same.

BACKGROUND

As a pitch of nodes of a semiconductor chip is reduced, a pitch of connection pads formed on a printed circuit board connected to the semiconductor chip is also finer. In addition, a printed circuit board for application to small electronic products such as mobile devices is packaged by mounting semiconductor chips such as one chip and stacked chips due to the limitation of a thickness of electronic products.

As a method for manufacturing a printed circuit board for manufacturing a printed circuit board having a connection pad having a fine pitch spacing with a thin thickness, there is provided an embedded trace substrate (ETS) method, and the printed circuit board manufactured therefrom is commercially available.

If a wire bonding pad of the printed circuit board manufactured by the ETS method is surface-treated, there is a limitation on management between the wire bonding pad requiring a fine pitch and an adjacent wire bonding pad, because a surface treatment layer is plated not only vertically from the outside of an insulating layer but also from a side surface.

There is a need to provide a technology that may increase the number of wire bonding pads in the same area by minimizing the pitch of wire bonding pads connected to extremely minimized chip nodes in a situation where the thickness of electronic products is limited.

SUMMARY

An aspect of the present disclosure may provide a printed circuit board in which an external connection pad and an adjacent external connection pad are maintained at a fine pitch.

Another aspect of the present disclosure may provide a printed circuit board reducing an occurrence of a short circuit between a wire bonding pad and an adjacent wire bonding pad by allowing a surface treatment layer to be plated on a side surface inside an insulating layer and not substantially plated on the side surface outside of the insulating layer, but to be vertically plated.

Another aspect of the present disclosure may provide an electronic component package including a printed circuit board in which wire bonding pads are formed at a fine pitch by preventing side surface plating from occurring outside of an insulating layer in forming a surface treatment layer.

According to an aspect of the present disclosure, a printed circuit board may include an insulating layer; and an external connection pad embedded in the insulating layer having one surface exposed. The external connection pad includes a base pad portion having a first pattern portion in contact with a side surface of the insulating layer and having a first width, and a second pattern portion protruding from the first pattern portion and having a second width smaller than the first width, the second pattern portion having a gap with the side surface of the insulating layer, and a surface treatment layer disposed in the gap between the second pattern portion and the insulating layer and extending on an upper surface of the second pattern portion.

According to another aspect of the present disclosure, a printed circuit board may include an insulating layer; a first external connection pad embedded in the insulating layer and exposed; and a second external connection pad disposed at a pitch distance from the first external connection pad and embedded in the insulating layer and exposed, wherein at least one of the first external connection pad or the second external connection pad includes: a base pad portion having a first pattern portion in contact with a side surface of the insulating layer and having a first width, and a second pattern portion protruding from the first pattern portion and having a second width smaller than the first width, the second pattern portion having a gap with the side surface of the insulating layer, and embedded in the insulating layer, a first metal layer disposed on a side surface and an upper surface of the second pattern portion, and a second metal layer disposed on the first metal layer.

According to another aspect of the present disclosure, an electronic component package may include a printed circuit board including an insulating layer, a base pad portion embedded in the insulating layer and having a stepped cross-sectional shape having different widths, and a surface treatment layer disposed in a gap between the base pad portion and the insulating layer and extending on an upper surface of the base pad portion; a semiconductor chip connected to the surface treatment layer; and an encapsulation layer encapsulating the semiconductor chip.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments in the present disclosure will be described with reference to the accompanying drawings.

The embodiments in the present disclosure may be changed in various forms, and are provided to more completely describe to those of ordinary skill in the art. Accordingly, the shape and size of elements in the drawings may be exaggerated for clarity, and elements indicated by the same reference numerals in the drawings refer to the same elements.

In the present disclosure, the meaning of "connection" is a concept including "directly connected" as well as "indirectly connected" through other configurations. In addition, it is a concept including all "electrically connected" in some cases.

In the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

The terms used in the present disclosure are used only to describe an example, and are not intended to limit the present disclosure. In this case, singular expressions include plural expressions unless the context clearly indicates otherwise.

Printed Circuit Board

Figure 1:
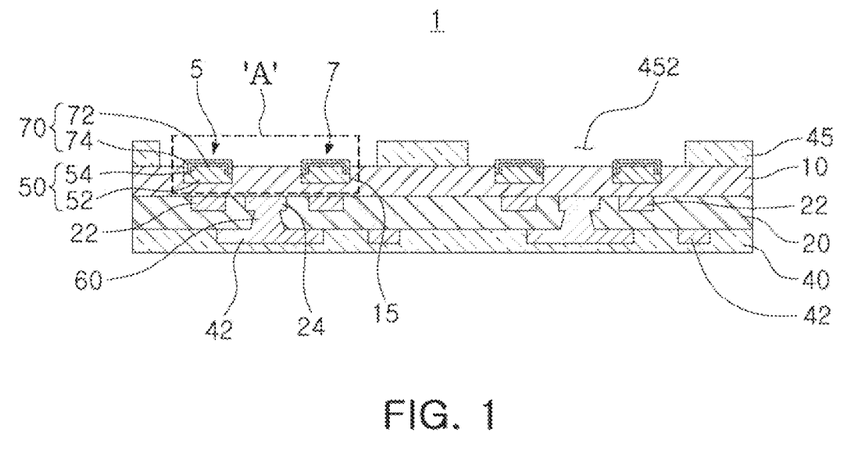
FIG. 1 is a schematic cross-sectional view illustrating a cross section of a printed circuit board according to an embodiment in the present disclosure.

FIG. 1 is a schematic cross-sectional view illustrating a cross section of a printed circuit board according to an embodiment in the present disclosure.

Referring to FIG. 1, a printed circuit board 1 according to an embodiment in the present disclosure may include an insulating layer 10 and external connection pads 5 and 7.

The external connection pad 5 embedded in the insulating layer 10 so as to expose one surface thereof may include a first pattern portion 52 and a second pattern portion 54. The first pattern portion 52 and the second pattern portion 54 may have a stepped cross-sectional shape, and may be defined as a base pad portion 50 as a concept relative to a surface treatment layer 70.

The base pad portion 50 may be a conductive metal layer formed by electroplating, chemical plating, or sputtering, and may include copper (Cu).

The first pattern portion 52 may be in contact with a side surface 15 of the insulating layer 10 and may have a first width W1. The second pattern portion 54 may protrude from the first pattern portion 52 with a second width W2 smaller than the first width W1, and may form a gap G with the side surface 15 of the insulating layer 10.

The surface treatment layer 70 is applied to the gap G between the second pattern portion 54 and the insulating layer 10 and an upper surface of the second pattern portion 54. The surface treatment layer 70 may be mounted by wire bonding or flip chip bonding with a semiconductor chip.

The printed circuit board 1 may be configured by stacking a plurality of insulating layers and wiring patterns, and the external connection pad 5 may be disposed in the insulating layer 10 of the outermost layer of the printed circuit board 1 to be connected to an external semiconductor chip. The external connection pad disposed in the insulating layer 10 of the outermost layer of the printed circuit board 1 may have a plurality of external connection pads including a first external connection pad 5 and a second external connection pad 7, and a spacing between the first external connection pad 5 and the second external connection pad 7 may form a fine pitch.

Meanwhile, when the insulating layer 10 of the outermost layer is referred to as a first insulating layer, a second insulating layer 20 may be disposed on the other surface of the first insulating layer 10, and a first wiring pattern 22 may be embedded in the second insulating layer 20. In addition, a second wiring pattern 24 spaced apart from the first wiring pattern 22 may be embedded in the second insulating layer 20. Here, the second wiring pattern 24 or the first wiring pattern 22 may be electrically connected to the external connection pad 5 or 7. The second wiring pattern 24 may be connected to a third wiring pattern 42 disposed on a third insulating layer 40 by a via 60.

The second insulating layer 20 and the third insulating layer 40 may be repeatedly built up to become a multilayered circuit board, and the number of layers may be selected as needed.

The first insulating layer 10 or the second insulating layer 20 may include a glass-containing insulating material or a glass-free inorganic insulating resin. Prepreg (PPG) may be used as the glass-containing insulating material, and ABF film may be used as the glass-free inorganic insulating resin. The insulating material is not particularly limited.

Meanwhile, the surface treatment layer 70 may include a first metal layer 72 in contact with the base pad portion 50 and a second metal layer 74 in contact with the first metal layer 72.

The first metal layer 72 may include any one of a gold (Au) layer, a silver (Ag) layer, or a nickel (Ni) layer. The first metal layer 72 is not particularly limited as long as it may be electrically connected to the base pad portion 50 of the insulating layer 10, and may be a metal layer formed by plating with nickel (Ni). In addition, the second metal layer may be formed as a multilayer in which a silver layer and a nickel layer are stacked.

The second metal layer 74 may include any one of a gold (Au) layer, a silver (Ag) layer, it a nickel (Ni) layer. The second metal layer 74 is a metal pad that is electrically connected to the semiconductor chip when the package is formed, and may be a metal layer formed by plating with gold (Au) to be advantageous for wire bonding.

On the insulating layer 10 of the printed circuit board 1 of the present embodiment, a solder resist layer 45 may be stacked to protect the external connection pads 5 and 7. In order to protect the external connection pads 5 and 7, the solder resist layer 45 may be stacked by a screen printing method using a photo solder resist (PSR) ink. The coating area and size of the solder resist may be determined in relation to the pattern shape and size of the designed external connection pads 5 and 7. The solder resist layer 45 may have an opening 452 exposing the external connection pads 5 and 7. When the opening 452 is formed by a laser, a non-photosensitive thermosetting resin may be used as the solder resist layer 45.

Figure 2:
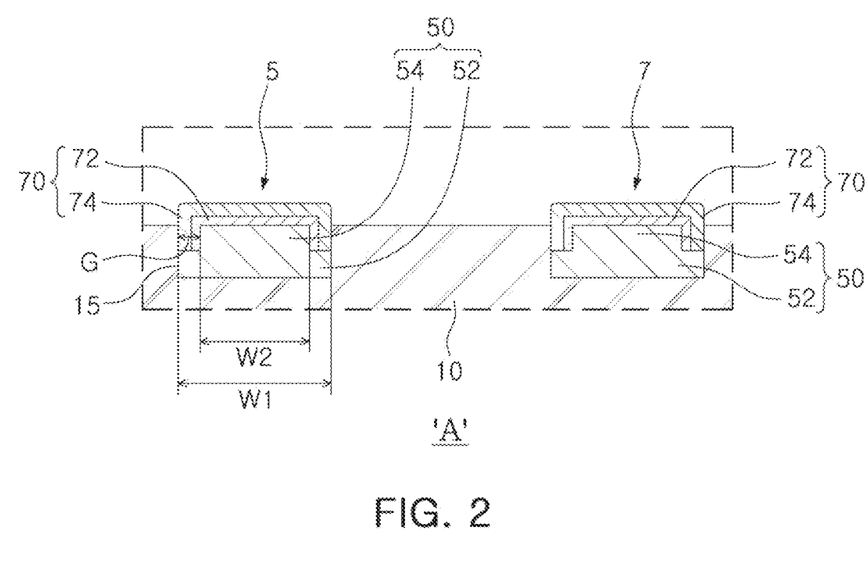
FIG. 2 is a schematic enlarged view of a first example of part A the printed circuit board of FIG. 1.
Figure 3:
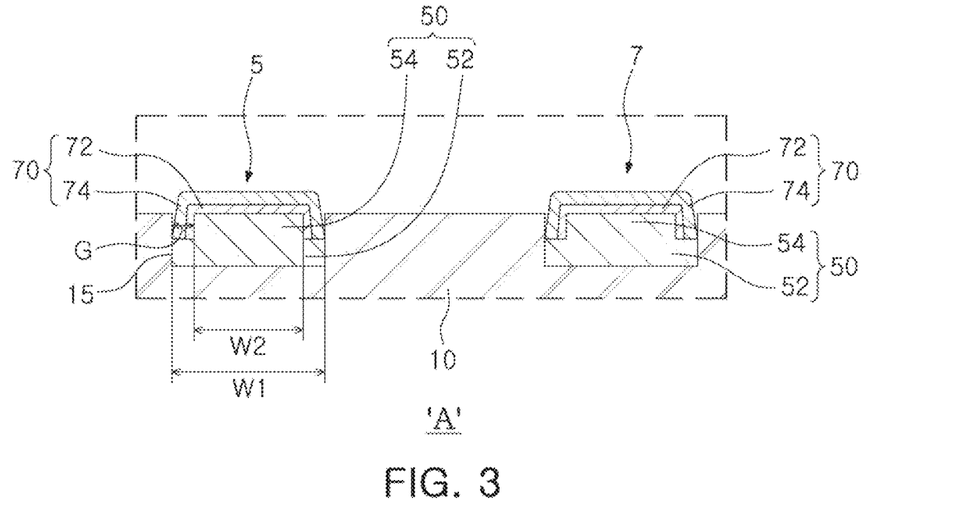
FIG. 3 is a schematic enlarged view of a second example of part A the printed circuit board of FIG. 1.

FIG. 2 is a schematic enlarged view of a first example of part A the printed circuit board of FIG. 1 and FIG. 3 is a schematic enlarged view of a second example of part A the printed circuit board of FIG. 1.

Referring to FIG. 2, the second metal layer 74 may fill the entire space of the gap G between the second pattern portion 54 of the base pad portion 50 and the insulating layer 10. Referring to FIG. 3, the second metal layer 74 may fill a portion of the gap G between the second pattern portion 54 of the base pad portion 50 and the insulating layer 10. It may be seen that some space remains in the gap G between the second pattern portion 54 and the insulating layer 10 because the second metal layer 74 is not entirely filled in the gap G between the second pattern portion 54 and the insulating layer 10.

In both the embodiments of FIGS. 2 and 3, the first width W1 of the first pattern portion 52 of the base pad portion 50 may be greater than the second width W2 of the second pattern portion 54, and an upper surface of the second pattern portion 54 may be substantially the same plane as, or substantially coplanar with, an upper surface of the insulating layer 10. Here, the expression "substantially same" may be interpreted as meaning that it is the same including a process error occurring in the manufacturing process or a positional deviation or error during measurement.

Meanwhile, in the embodiments of FIGS. 2 and 3, the upper surface of the surface treatment layer 70 may protrude to be slightly higher than the upper surface of the insulating layer 10 in a direction in which the second pattern portion 54 protrudes from the first pattern portion 52. In the second metal layer 74 of the surface treatment layer 70, side plating may be disposed in the insulating layer 10, but substantially vertical plating may be disposed outside of the insulating layer 10. In other words, the second metal layer 74 may not be formed due to side plating on the upper surface of the insulating layer 10 outside of the gap G.

Figure 4A:
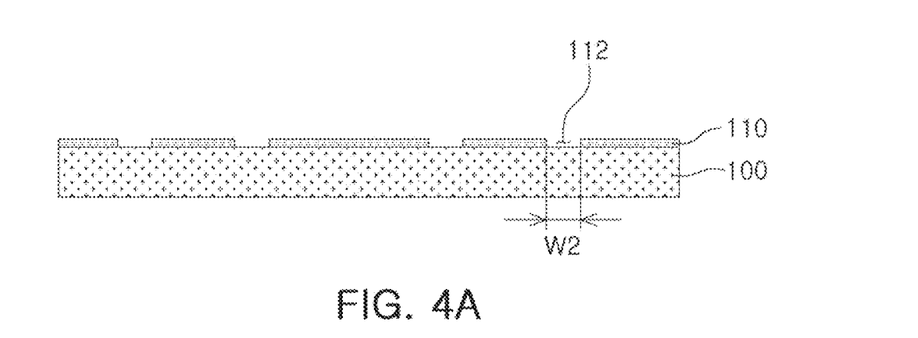
FIGS. 4A through 4P are cross-sectional views illustrating a manufacturing method for manufacturing part A of the printed circuit board of FIG. 1.
Figure 4B:
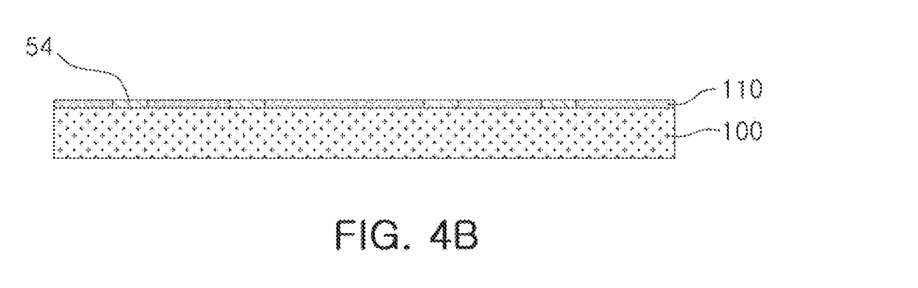
Figure 4C:
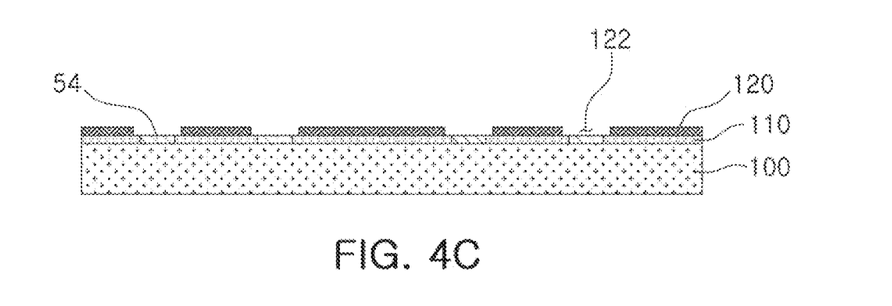
Figure 4D:
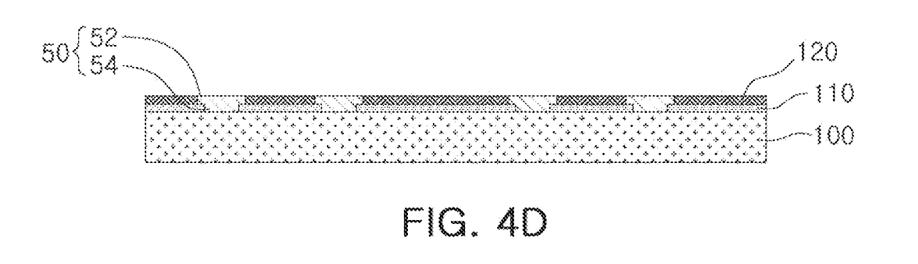
Figure 4E:
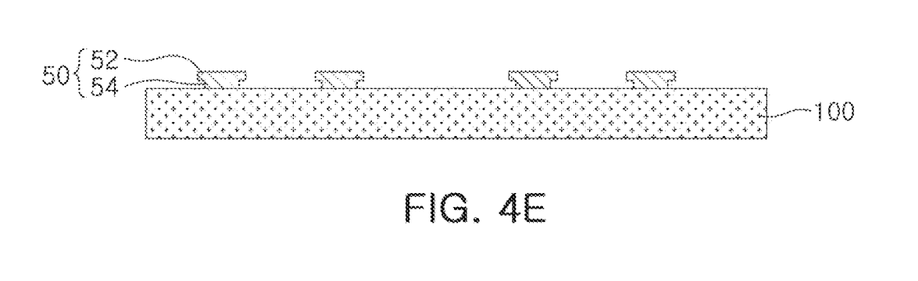
Figure 4F:
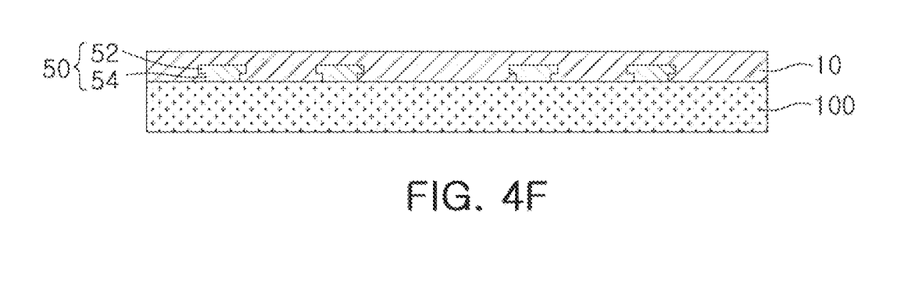
Figure 4G:
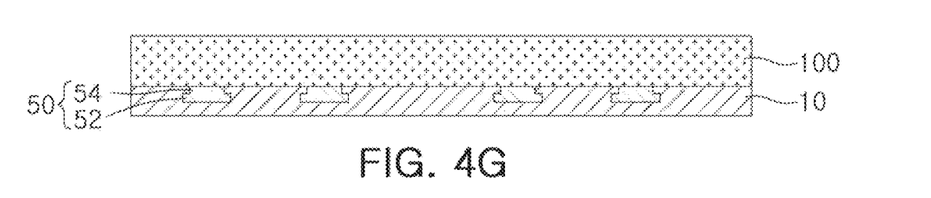
Figure 4H:
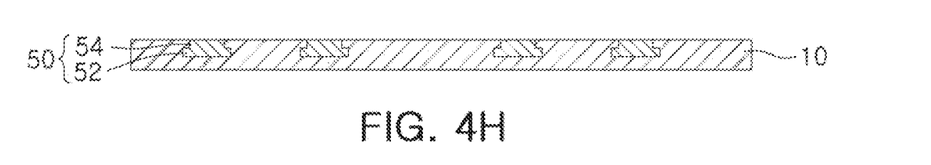
Figure 4I:
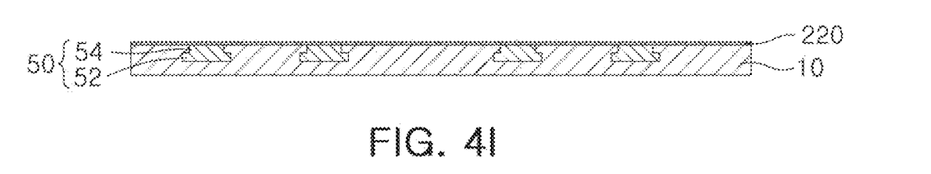
Figure 4J:
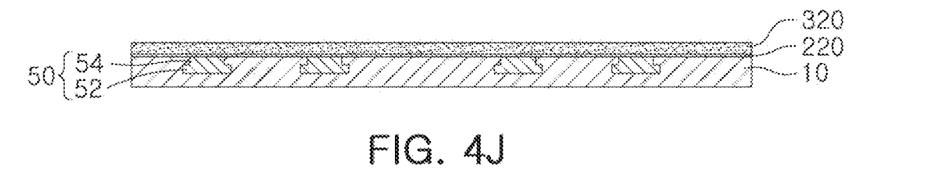
Figure 4K:
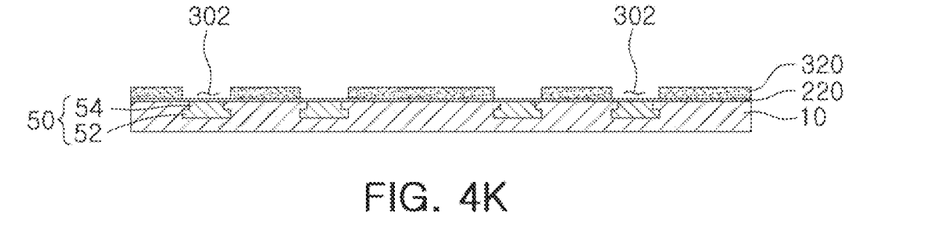
Figure 4L:
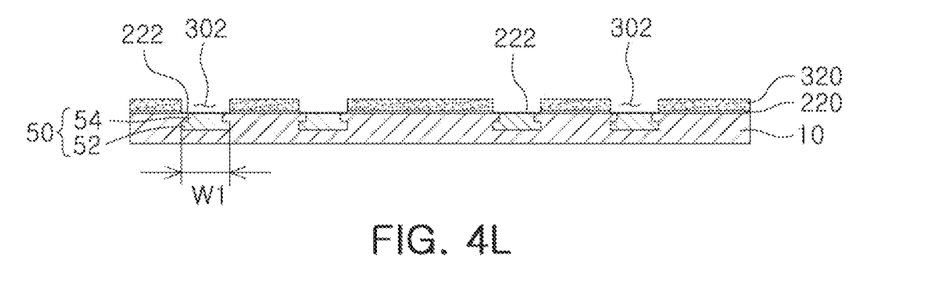
Figure 4M:
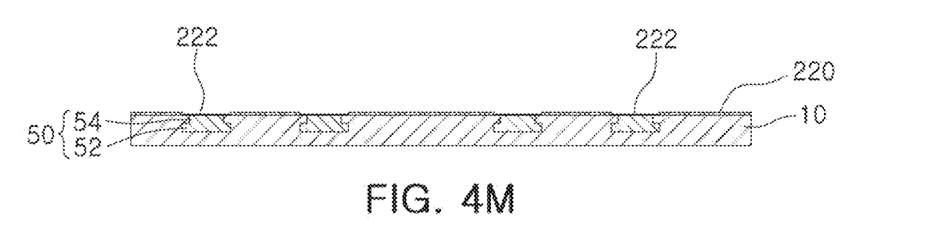
Figure 4N:
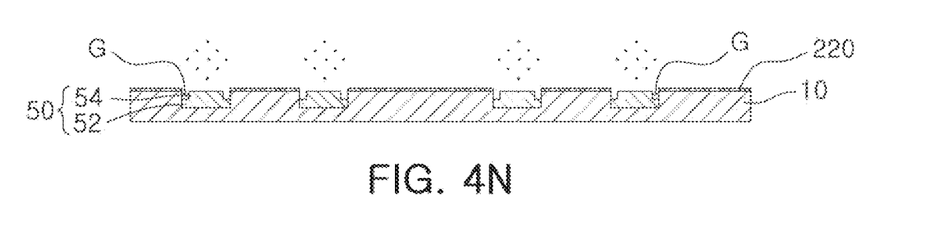
Figure 4O:
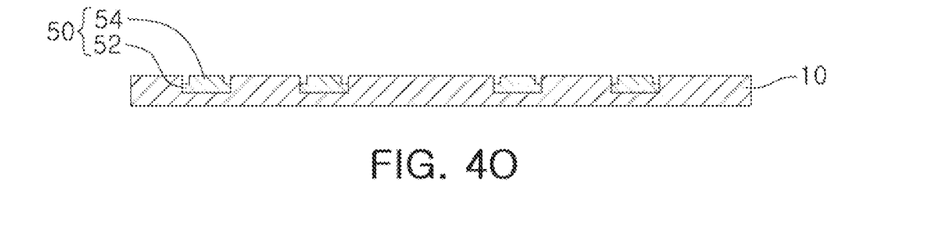
Figure 4P:
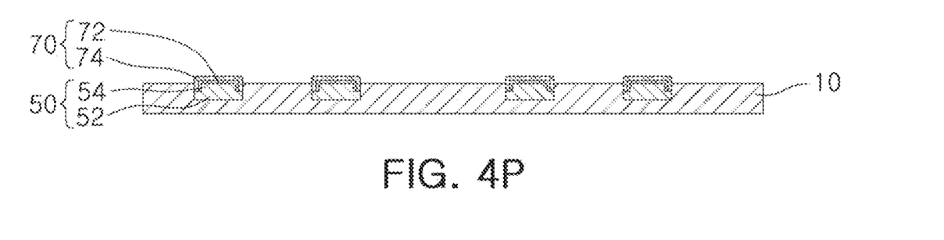

FIGS. 4A through 4P are cross-sectional views illustrating a manufacturing method for manufacturing part A (the external connection pad embedded in the insulating layer) of the printed circuit board of FIG. 1.

FIGS. 4A through 4P illustrate an example of a manufacturing method for manufacturing a printed circuit board according to an embodiment in the present disclosure. Each process may be conducted in a different order, unless the context clearly indicates a specific order.

In FIG. 4A, a second dry film 110 may be laminated on a first dry film 100 provided with a plating seed layer (not illustrated) on an upper surface, and the second dry film 110 may be exposed and developed to form a first opening 112 corresponding to a second width W2 of a second pattern portion 54 of a base pad portion 50.

In FIG. 4B, the second pattern portion 54 may be formed by filling the first opening 112 disposed in the second dry film 110 with metal through a plating process or the like.

In FIGS. 4C through 4E, a third dry film 120 may be stacked on the second dry film 110 on which the second pattern portion 54 is disposed, and a second opening corresponding to the first width W1 greater than a second width W2 may be formed. In addition, a first pattern portion 52 may be formed by filling the second opening 122 with metal through a plating process. The metal filling the first opening 112 and the second opening 122 may be copper (Gu). After forming the first pattern portion 52 by plating the second opening 122 with copper, the second dry film 110 and the third dry film 120 may be peeled off.

In FIGS. 4F through 4H, after stacking an insulating layer 10, the first dry film 100 may be vertically inverted, and the first dry film 100 may be peeled off so that the second pattern portion 54 is exposed on the upper surface of the insulating layer 10.

In FIG. 4I, a copper foil 220 may be stacked on the insulating layer 10 and the second pattern portion 54.

In FIGS. 4J through 4M, an etching resist 320 of an insulating material may be stacked on the copper foil 220 stacked on the second pattern portion 54 of the base pad portion 50 and the insulating layer 10. In addition, the etching resist 320 may be exposed and developed to form a third opening 302 so that the copper foil 220 on the base pad portion 50 is exposed. Here, a width of the third opening 302 may be formed to be substantially the same as the first width W1 of the first pattern portion 52. In addition, in the third opening 302, the copper foil 220 may be etched thin enough to be removed by sandblasting to form an etched copper foil 222, and the etching resist 320 may be peeled off.

In FIG. 4N, sandblasting may be performed on the etched copper foil 222 using the copper foil 220 as a mask. By removing the etched copper foil 222 and the insulating layer 10 around the second pattern portion 54 through sandblasting, a gap G between the insulating layer 10 and the second pattern portion 54 may be formed. Here, the strength of sandblasting is selected such that the etched copper foil 222 and the insulating layer 10 are removed, but the copper foil 220, the first pattern portion 52, and the second pattern portion 54 are not removed.

FIGS. 4O and 4P, first, nickel (Ni) plating may be performed to form a first metal layer 72, and gold (Au) plating may be performed on the first metal layer 72 to form a second metal layer 74. Here, the gap G between the second pattern portion 54 and the insulating layer 10 may be controlled so that the first metal layer 72 and the second metal layer 74 are plated on the side surface in the insulating layer and are vertically plated outside of the insulating layer.

Depending on the degree of side surface plating, the second metal layer 74 is not completely filled in a portion of the gap G, so that the degree of protrusion of the second metal layer 74 to an upper portion of the insulating layer 10 may be lowered.

Referring again to FIGS. 1 through 4P, an example of the disclosed printed circuit board 1 will be described again.

The printed circuit board may include the insulating layer 10, the first external connection pad 5, and the second external connection pad 7.

The first external connection pad 5 and the second external connection pad 5 may be embedded in the insulating layer 10 to expose their upper surfaces, and may be formed at a fine pitch distance.

At least one of the first external connection pad 5 and the second external connection pad 7 may include the base pad portion 50, and the first metal layer 72 and the second metal layer 74 as surface treatment layers.

The base pad portion 50 may have the first pattern portion 52 in contact with the side surface 15 of the insulating layer 10 and having the first width W1, and the second pattern portion 54 protruding from the first pattern portion 52 with the second width W2 smaller than the first width W1, having the gap G with the side surface 15 of the insulating layer 10, and embedded in the insulating layer 10.

The first metal layer 72 may be disposed on a side surface of the second pattern portion 54 and an upper surface of the second pattern portion 54, and the second metal layer 74 may be disposed on the first metal layer 72.

The first metal layer 72 may include nickel (Ni), and the second metal layer 74 may include gold (Au).

In addition, as in the embodiment of FIG. 2, the second metal layer 74 may fill the entire space of the gap G between the side surface 15 of the insulating layer 10 and the side surface of the first metal layer 72. As in the embodiment of FIG. 3, the second metal layer 74 may be disposed in a portion of the gap G between the side surface 15 of the insulating layer 10 and the side surface of the first metal layer 72.

Meanwhile, the upper surface of the second pattern portion 54 is substantially the same plane as, or substantially coplanar with, the upper surface of the insulating layer 10 so that a protrusion height from the insulating layer 10 of the first metal layer 72 and the second metal layer 74 may be formed to be low.

However, the upper surface of the second metal layer 74 may be maintained higher than the upper surface of the insulating layer 10 in a direction in which the second pattern portion 54 protrudes from the first pattern portion 52.

In addition, the solder resist layer 45 may be disposed on the insulating layer 10 and may include an opening 452 exposing the first external connection pad 5 and the second external connection pad 7. The solder resist layer 45 may increase reliability of bonding and protect the external connection pads when semiconductor chips are mounted on the first external connection pad 5 and the second external connection pad 7 by wire bonding or flip chip bonding.

Electronic Component Package

Figure 5:
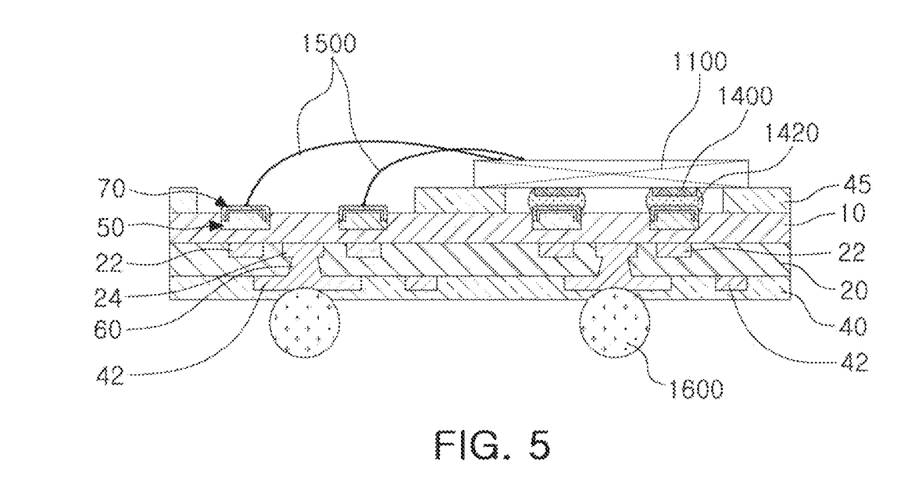
FIGS. 5 and 6 are schematic views illustrating an electronic component package formed by coupling the printed circuit board according to an embodiment in the present disclosure to a semiconductor chip.
Figure 6:
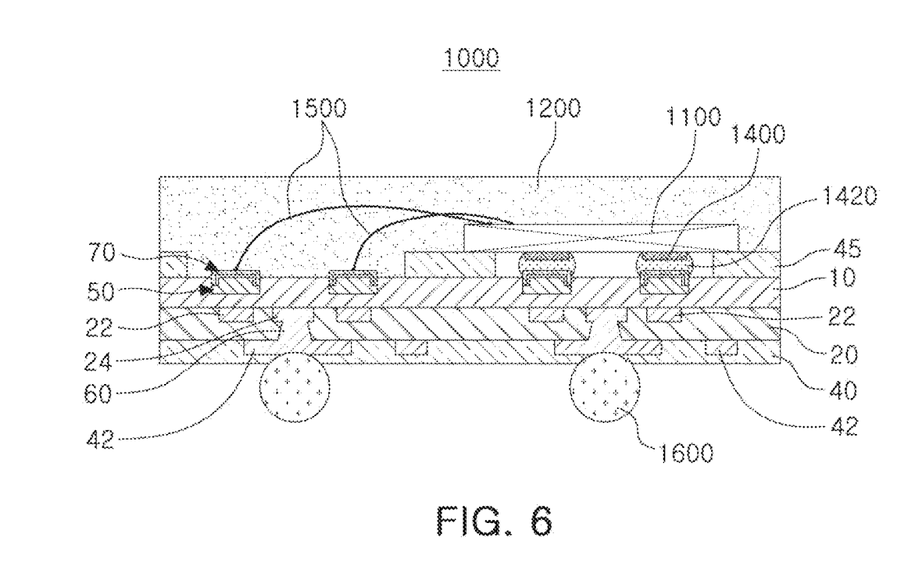

FIGS. 5 and 6 are schematic views illustrating an electronic component package formed by coupling the printed circuit board according to an embodiment in the present disclosure to a semiconductor chip.

Referring to FIGS. 5 and 6, The electronic component package 1000 according to an embodiment in the present disclosure may include the printed circuit board 1 described above, a semiconductor chip 1100, and an encapsulation layer 1200.

The printed circuit board 1 may include an insulating layer 10, a base pad portion 50 embedded in the insulating layer 10 and having a stepped cross-sectional shape having a different width, and a surface treatment layer 70 disposed on a gap G formed between the base pad portion 50 and a side surface of the insulating layer 10 and an upper surface of the base pad portion 50.

The semiconductor chip 1100 may be connected to the surface treatment layer 70 of the external connection pads 5 and 7 of the printed circuit board 1 to exchange electrical signals with the printed circuit board 1. Here, the external connection pads 5 and 7 may be connected to the semiconductor chip 1100 with at least one of wire bonding 1500 and flip chip bonding. In the case of flip chip bonding, a connection terminal 1400 of the semiconductor chip 1000 may be connected to the external connection pad 5 of the printed circuit board through a solder bump 1420.

The encapsulation layer 1200 illustrated in FIG. 6 may mold the semiconductor chip 1100 to protect an electronic component from an external environment. In addition, a connection structure such as a solder ball 1600 may be provided on the third wiring pattern 42 which is the outermost wiring pattern. An insulating material may be used as the encapsulation layer 1200, and a thermosetting resin such as an epoxy resin or a thermoplastic resin such as polyimide may be used as the insulating material. In addition, a material containing inorganic filler such as silica in these resins may be used. For example, as the material of the encapsulant, ABF may be used. However, the material of the encapsulant is not limited thereto, and other types of epoxy molding compound (EMC) may be used, and photo imageable dielectric (PID) may be used.

As set forth above, according to the printed circuit board of the present disclosure, in the insulating layer, the external connection pad and the adjacent external connection pad may be maintained at the fine pitch.

According to the printed circuit board of the present disclosure, the occurrence of the short circuit between the wire bonding pad and the adjacent wire bonding pad may be prevented while maintaining the fine pitch therebetween by allowing the surface treatment layer to be plated on the side surface inside the insulating layer and not substantially plated on the side surface outside of the insulating layer, but to be only vertically plated.

According to the electronic component package including the printed circuit board of the present disclosure, since the spacing between the external connection pads may achieve an ultra-fine pitch, the design freedom and integration degree of the semiconductor chip nodes may be improved and the reliability of wire bonding may be secured.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating layer; and
an external connection pad embedded in the insulating layer and having one surface exposed,
wherein the external connection pad includes:
a base pad portion having a first pattern portion having a first width, and a second pattern portion protruding from the first pattern portion and having a second width smaller than the first width, a side surface of the first pattern portion being in contact with the insulating layer, and a side surface of the second pattern portion being spaced apart from the insulating layer; and
a surface treatment layer disposed in a gap between the second pattern portion and the insulating layer and extending on an upper surface of the second pattern portion, and
wherein at least a portion of a lower surface of the base pad portion is in contact with the insulating layer.

2. The printed circuit board of claim 1, wherein the surface treatment layer includes a first metal layer including nickel (Ni) in contact with the base pad portion and a second metal layer including gold (Au) in contact with the first metal layer, and
the second metal layer fills a portion of the gap between the second pattern portion and the insulating layer.

3. The printed circuit board of claim 1, wherein the surface treatment layer includes a first metal layer including nickel (Ni) in contact with the base pad portion and a second metal layer including gold (Au) in contact with the first metal layer, and
the second metal layer fills an entire space of the gap between the second pattern portion and the insulating layer.

4. The printed circuit board of claim 1, wherein the upper surface of the second pattern portion is substantially coplanar with an upper surface of the insulating layer.

5. The printed circuit board of claim 1, wherein an upper surface of the surface treatment layer is higher than an upper surface of the insulating layer in a direction in which the second pattern portion protrudes from the first pattern portion.

6. The printed circuit board of claim 1, further comprising a solder resist layer disposed on the insulating layer and having an opening exposing the external connection pad.

7. The printed circuit board of claim 1, wherein the insulating layer includes a groove on an upper surface thereof, and the external connection pad is disposed in the groove, and
a width of the groove is substantially the same as the first width of the first pattern portion.

8. The printed circuit board of claim 1, wherein the surface treatment layer includes a portion embedded in the groove and a portion protruding from an upper surface of the insulating layer.

9. The printed circuit board of claim 1, wherein a bottom surface of the first pattern portion is spaced apart from a bottom surface of the insulating layer.

10. The printed circuit board of claim 1, wherein the surface treatment layer does not overlap an upper surface of the insulating layer.

11. A printed circuit board comprising:
an insulating layer;

a first external connection pad embedded in the insulating layer and exposed; and a second external connection pad disposed at a pitch distance from the first external connection pad and embedded in the insulating layer and exposed, wherein at least one of the first external connection pad or the second external connection pad includes:

a base pad portion having a first pattern portion having a first width, and a second pattern portion protruding from the first pattern portion and being embedded in the insulating layer and having a second width smaller than the first width, a side surface of the first pattern portion being in contact with the insulating layer, and a side surface of the second pattern portion being spaced apart from the insulating layer;

a first metal layer disposed on a side surface and an upper surface of the second pattern portion; and a second metal layer disposed on the first metal layer, and wherein at least a portion of a lower surface of the base pad portion is in contact with the insulating layer.

12. The printed circuit board of claim 11, wherein the first metal layer includes nickel (Ni), and the second metal layer includes gold (Au).

13. The printed circuit board of claim 11, wherein the second metal layer fills a portion of a gap between the side surface of the insulating layer and a side surface of the first metal layer.

14. The printed circuit board of claim 11, wherein the second metal layer fills an entire space of a gap between the side surface of the insulating layer and a side surface of the first metal layer.

15. The printed circuit board of claim 11, wherein the upper surface of the second pattern portion is substantially coplanar with an upper surface of the insulating layer.

16. The printed circuit board of claim 11, wherein an upper surface of the second metal layer is higher than an upper surface of the insulating layer in a direction in which the second pattern portion protrudes from the first pattern portion.

17. The printed circuit board of claim 11, further comprising a solder resist layer disposed on the insulating layer and having an opening exposing the external connection pad.

18. An electronic component package comprising:

a printed circuit board including an insulating layer, a base pad portion embedded in the insulating layer and having a stepped cross-sectional shape having different widths, and a surface treatment layer disposed in a gap between the base pad portion and the insulating layer and extending on an upper surface of the base pad portion, wherein at least a portion of a lower surface of the base pad portion is in contact with the insulating layer;

a semiconductor chip connected to the surface treatment layer; and an encapsulation layer encapsulating the semiconductor chip.

19. The electronic component package of claim 18, wherein the upper surface of the base pad portion is substantially the same as an upper surface of the insulating layer.

20. The electronic component package of claim 18, wherein the surface treatment layer is connected to the semiconductor chip by at least one of wire bonding and flip chip bonding.

* * * * *